United States Patent
Ahn et al.

(10) Patent No.: US 7,833,914 B2
(45) Date of Patent: Nov. 16, 2010

(54) CAPACITORS AND METHODS WITH PRASEODYMIUM OXIDE INSULATORS

(75) Inventors: Kie Y. Ahn, Chappaqua, NY (US); Leonard Forbes, Corvallis, OR (US); Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 533 days.

(21) Appl. No.: 11/796,289

(22) Filed: Apr. 27, 2007

(65) Prior Publication Data

US 2008/0268605 A1 Oct. 30, 2008

(51) Int. Cl.
H01L 21/31 (2006.01)
(52) U.S. Cl. .................. 438/786; 438/381; 438/386; 438/393
(58) Field of Classification Search ................ 438/381, 438/386, 393, 786
See application file for complete search history.

(56) References Cited

U.S. PATENT DOCUMENTS

| | | | |
|---|---|---|---|
| 2002/0017658 A1* | 2/2002 | Tsubouchi et al. | 257/200 |
| 2003/0168750 A1* | 9/2003 | Basceri et al. | 257/915 |
| 2006/0110870 A1* | 5/2006 | Bhattacharyya | 438/197 |
| 2006/0125030 A1* | 6/2006 | Ahn et al. | 257/411 |
| 2006/0273366 A1* | 12/2006 | Ko et al. | 257/295 |
| 2007/0066015 A1* | 3/2007 | Park et al. | 438/257 |
| 2008/0121963 A1* | 5/2008 | Govindarajan | 257/310 |

OTHER PUBLICATIONS

Adachi et al. "The Binary Rare earth oxides" 1998 Chem. Rev. pp. 1479-1514.*

Aarik, Jaan, "Atomic layer growth of epitaxial $TiO_2$ thin films from $TiCl_4$ and $H_2O$ on α-$Al_2O_3$ substrates", *Journal of Crystal Growth*, 242(1-2), (2002), 189-198.

Armacost, M, et al., "A high reliability metal insulator metal capacitor for 0.18 um copper technology", *Electron Devices Meeting, IEDM Technical Digest. International*, IBM Semiconductor Research and Development Center, Hopewell Junction, NY,(2000), 157-160.

Babcock, Jeffrey A., et al., "Analog Characteristics of Metal-Insulator-Metal Capacitors using PECVD Nitride Dielectrics", *IEEE Electron Device Letters*, vol. 22 Part 5, (2001),230-232.

Chen, S B., et al., "High-density MIM capacitors using $Al_2O_3$ and $AlTiO_x$ dielectrics", *IEEE Electron Device Letters*, 23(4), (Apr. 2002), 185-87.

(Continued)

*Primary Examiner*—Bradley K Smith
(74) *Attorney, Agent, or Firm*—Schwegman, Lundberg & Woessner, P.A.

(57) ABSTRACT

Methods of forming and the resulting capacitors formed by these methods are shown. Monolayers that contain praseodymium are deposited onto a substrate and subsequently processed to form praseodymium oxide dielectrics. Monolayers that contain titanium or other metals are deposited onto a substrate and subsequently processed to form metal electrodes. Resulting capacitor structures includes properties such as improved dimensional control. One improved dimensional control includes thickness. Some resulting capacitor structures also include properties such as an amorphous or nanocrystalline microstructure. Selected components of capacitors formed with these methods have better step coverage over substrate topography and more robust film mechanical properties.

19 Claims, 3 Drawing Sheets

OTHER PUBLICATIONS

Emonet, Nicolas, et al., "Evolution of stacked-capacitor technology for embedded-DRAM applications", *C Alliance—icmtd.com*, (2005), 67-70.

Hu, Hang, "A high performance MIM capacitor using HfO2 dielectrics", *IEEE Electron Device Letters*, 23(9), 2002.

Ishikawa, Tsuyoshi, "High-Capacitance Cu/$Ta_2O_5$/Cu MIM Structure for SoC Applications Featuring a Single-Mask Add-on Process", *2002 International Electron Devices Meeting*, (2002),940-942.

Lee, Sang-Yun, et al., "Atomic layer deposition of $ZrO_2$ on W for metal-insulator-metal capacitor application", *Applied Physics Letters*, 82(17), (Apr. 28, 2003).

Lucovsky, Gerald, et al., "Asymmetries in the electrical activity of intrinsic grain-boundary and O-Atom vacancy defects in $HFO_2$ $ZRO_2$ at their interfaces with $SIO_2$: a possible show stopper for CMOS high k devices", *IEEE SISC 2005*, Dec. 1-3, Arlington VA, (2005).

Min, Jae-Sik, et al., "Metal-Organic Atomic-Layer Deposition of Titanium-Silicon-Nitride Films", *Applied Physics Letters*, 75(11), (Sep. 13, 1999), 1521-1523.

Potter, Richard J., et al., "Deposition of $HfO_2$, $Gd_2O_3$ and $PrO_x$ by Liquid Injection ALD Techniques", *Chemical Vapor Deposition*, 11(3), (2005), 159-169.

Schuisky, Mikael, "Atomic Layer Chemical Vapor Deposition of $TiO_2$ Low Temperature Epitaxy fo Rutile and Anatase", *Journal of the Electrochemical Society*, 147(9), (2000),3319-3325.

Sneh, Ofer, "Thin film atomic layer deposition equipment for semiconductor processing", *Thin Solid Films*, 402(1-2), (2002),248-261.

Wenger, C, et al., "First investigation of metal-insulator-metal (MIM) capacitor using $Pr_2O_3$ dielectics", *Materials Science in Semiconductor Processing 7*, (2004), 227-30.

Zurcher, P, et al., "Integration of Thin Film MIM Capacitors and Resistors Into Copper Metallization Based RF-CMOs and BI-CMOs Technologies", *International Electron Devices Meeting (IEDM)*, Technical Digest; San Francisco, CA; Dec. 10-13, 2000; New York, NY,(Dec. 10, 2000), 153-156.

* cited by examiner

CAPACITORS AND METHODS WITH PRASEODYMIUM OXIDE INSULATORS

TECHNICAL FIELD

This application relates generally to capacitor devices, fabrication methods, and electronic devices in which such capacitors are used.

BACKGROUND

Capacitors in general, and specifically metal-insulator-metal (MIM) capacitors, are useful in a variety of electronic devices. Examples of electronic devices include radio frequency circuits or mixed signal circuits, and higher level electronic devices such as cellular telephones, global positioning systems (GPS) personal digital assistants, handheld e-mail devices, etc. Other electronic device examples include memory devices with capacitor data storage.

There is a continual desire to reduce the size of electronic components such as capacitors. Size reduction allows for smaller devices with more portability and/or increased density with more device capabilities. High-K dielectric materials have been used to allow some degree of size reduction and device reliability; however, further size reductions and increased device reliability is desired.

Praseodymium oxide is one high-K dielectric material that has been used in MIM capacitors to improve capacitor size and performance. Current deposition methods of praseodymium oxide such as sputtering or molecular beam epitaxy can produce dielectric films; however, there remains a need for improved film properties and device reliability.

What are needed are methods to form metal-insulator-metal capacitors that produce improved structures with improved properties such as desired levels of crystallinity, step coverage, mechanical properties, film continuity, etc. What are also needed are improved metal-insulator-metal capacitors, structures, etc. and devices utilizing these structures to take advantage of the improved properties.

DETAILED DESCRIPTION

In the following detailed description of the invention, reference is made to the accompanying drawings that form a part hereof and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "wafer" and "substrate" used in the following description include any structure having an exposed surface with which to form an electronic device or device component such as a component of an integrated circuit (IC). The term substrate is understood to include semiconductor wafers. The term substrate is also used to refer to semiconductor structures during processing and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors. The term monolayer is defined as a material layer that is substantially one molecule thick. In some embodiments, one molecule includes one atom, while other molecules are comprised of several atoms. The term monolayer is further defined to be substantially uniform in thickness, although slight variations of between approximately 0 to 2 monolayers results in an average of a single monolayer as used in description below. The term metal is defined as a conductive metal or conductive metal compound used in electrical components or circuitry. The term metal is used in contrast to semiconductor materials such as silicon, gallium arsenide, etc. that are less conductive than metal materials, however in selected examples, heavily doped semiconductors such as heavily doped silicon are considered as metals for the purposes of forming capacitors as described below.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Figure 1:
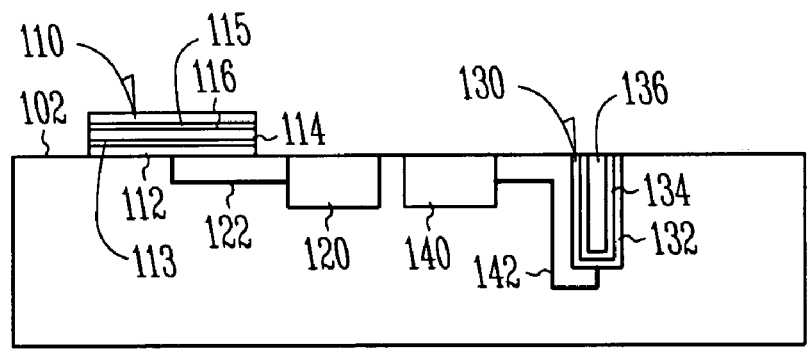
FIG. 1 shows a surface of an electronic device in a stage of processing according to an embodiment of the invention.

FIG. 1 shows a substrate surface 102 of an electrical device such as an integrated circuit chip. A number of components are shown fabricated on or within the surface 102. A planar capacitor 110 is shown electrically coupled to a first device 120 through transmission line 122. In one embodiment the first device 120 includes an access transistor of a memory cell. Transistors in other circuit configurations or devices other than transistors such as resistors, inductors, etc. are also within the scope of the invention for embodiments such as the first device 120.

The planar capacitor 110 includes a first electrode 112, a second electrode 116, and a dielectric 114 located between the first electrode 112 and the second electrode 116. The dielectric 114 includes a praseodymium oxide dielectric with unique properties as a result of fabrication methods discussed below. In one embodiment, the first electrode 112, the second electrode 116, or both the first and second electrode 112, 116 also include unique properties as a result of fabrication methods discussed below.

In one embodiment, both the first electrode 112 and the second electrode are metals to form a metal-insulator-metal (MIM) capacitor. In one embodiment, one of the electrodes includes a semiconductor such as silicon. In such examples, silicon can be lightly doped and still considered a semiconductor for a metal-insulator-semiconductor (MIS) capacitor. In selected configurations, a heavily doped semiconductor is used for at least one of the electrodes. In such examples, the heavily doped semiconductor is considered to be a metal due to high conductivity.

Praseodymium oxide is selected due to a combination of desirable properties. For example, as indicated in the table below, $Pr_2O_3$ provides a high barrier energy at interfaces and can be formed very thin at an acceptable performance standard such as a minimum leakage of $1\times10^{-3}$ A/cm$^2$ at 1.25 v operating voltage. This leads to a high capacitance density which is approximately 3.5 times higher than silicon dioxide.

|  | $SiO_2$ | $Al_2O_3$ | $ZrO_2$ | $HfO_2$ | $Ta_2O_5$ | $TiO_2$ | $La_2O_3$ | $Pr_2O_3$ |
|---|---|---|---|---|---|---|---|---|
| K: $E/E_0$ | 3.9 | 9-10 | ~20 | ~25 | ~26 | ~80 | ~30 | ~31 |
| Conduction band energy (eV) | 0.9 | 1.3 | 2.4 | 2.6 | 4.0 | 4.1 | 1.8 | 1.1 |
| Barrier energy (eV) | 3.2 | 2.8 | 1.7 | 1.5 | 0.1 | 0.0 | 2.3 | 2.0 |
| Bandgap (eV) | 9.0 | 8.7 | 7.8 | 5.7 | 4.5 | 3.5 | 4.3 | 5.1 |
| Equiv. oxide thickness (EOT in nm) | 3.5 | 1.8 | 1.7 | 1.5 | 3.75 | 2.8 | ~1.0 | 1.0 |
| Min. thickness for 100 nm node | 3.5 | 5.5 | 8.5 | 13.6 | 25.0 | 58.0 | ~8.0 | ~8.0 |
| Cap. density ($fF/u^2$) | 10 | ~20 | ~20 | ~17 | ~9.0 | ~12.5 | ~35 | ~35 |
| Normalized figure of merit | 1 | 2 | 2 | 1.7 | 0.9 | 1.25 | 3.5 | 3.5 |

In some configurations, it is desirable to reduce interfacial reactions between praseodymium oxide and adjacent materials such as silicon. In one embodiment, as shown in FIG. 1, a first interfacial layer 113 and a second interfacial layer 115 are included to better control reactions between the praseodymium oxide 114 and adjacent materials. In one example, both the first interfacial layer 113 and the second interfacial layer 115 are the same. In other embodiments, the first interfacial layer 113 and the second interfacial layer 115 are different materials, chosen to provide interfaces with different adjacent materials.

Although a single interfacial layer is shown between the dielectric 114 and each electrode 112, 114, other configurations include multiple interfacial layers. Also, in some devices at least one chemically homogenous interfacial layer is formed by processing a laminate stack such as a composite laminate stack as described in embodiments below.

Examples of effective interfacial layers include Pr—O—N, TiN, Ti—Si—N, and Pr—Si—O. One particularly effective stoichiometry for Pr—O—N in atomic percentages includes 40Pr, 20O, 40N. Such stoichiometry provides low chemical reactivity, and is substantially amorphous, which reduces the chance of potential leakage along grain boundaries. Pr—O—N interfacial layers are effective at blocking transport of a number of impurities including, but not limited to hydrogen.

A trench capacitor 130 is further shown in FIG. 1 electrically coupled to a second device 140 through transmission line 142. Similar to the first device 120, in one embodiment the second device 140 includes an access transistor of a memory cell. Transistors in other circuit configurations or devices other than transistors are also within the scope of the invention for the second device 140.

The trench capacitor 130 includes a first electrode 132, a second electrode 136, and a dielectric 134 separating the first electrode 132 from the second electrode 136. The dielectric 134 includes a praseodymium oxide dielectric with unique properties as a result of fabrication methods discussed below. Similar to the planar capacitor 110, in one embodiment, the first electrode 132, the second electrode 136, or both the first and second electrode 132, 136 also include unique properties as a result of fabrication methods discussed below. Although not shown in FIG. 1, trench capacitors or other capacitors with interfacial layers such as 113 and 115 described above are also included in one embodiment. Although a planar capacitor 110 and a trench capacitor 130 are used as examples, the invention is not so limited. Other capacitor configurations such as stacked capacitors, etc. are also within the scope of the invention.

The dielectrics 114 and 134 are formed using monolayer deposition methods as described in embodiments below. Methods include atomic layer deposition (ALD) techniques, chemically self-limiting techniques, or other techniques that form monolayers with controlled thickness. As defined above, the term monolayer defines a layer that is substantially one molecule or one atom thick. Although substantially one layer thick, some variation on the order of 0 to 2 molecules is within the scope of the invention. Using monolayer deposition techniques, thicker device structures such as dielectrics and/or electrodes can also be formed by sequentially depositing a number of monolayers.

Layers and other structures formed using monolayer deposition methods provide a unique structure compared to other deposition methods. Using monolayer deposition methods described below, capacitor components can be formed with step coverage over surface topography that is superior to other deposition techniques such as conventional chemical vapor deposition (CVD), molecular beam epitaxy (MBE), sputtering, etc. Selected monolayer processing methods can provide a substantially amorphous component structure that is not possible using other deposition techniques. Other processing variations provide a fine crystal distribution such as a nanocrystalline component structure. Micro-scale and nano-scale crystal structures provide unique physical properties such as highly durable films. Highly consistent component thickness and highly smooth and continuous surfaces are also provided using monolayer methods described. Capacitor performance and reliability is significantly improved as a result of characteristics such as step coverage, consistent thickness, smooth surfaces, continuous surfaces, etc.

Figure 2:
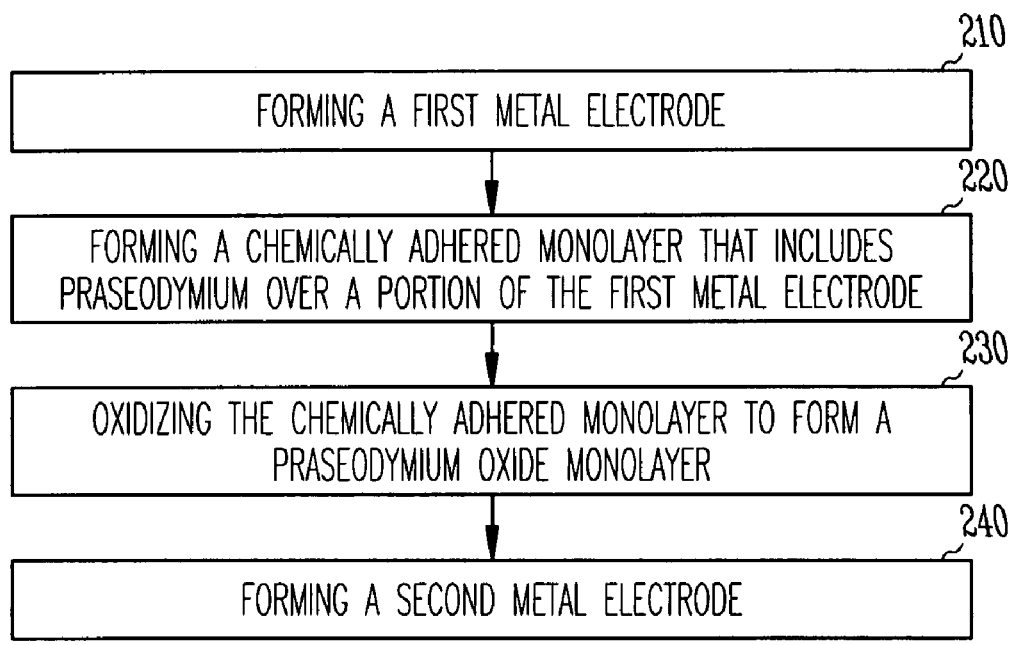
FIG. 2 shows a method of forming a material layer or structure according to an embodiment of the invention.

FIG. 2 shows a flow diagram of an example method of forming a capacitor according to an embodiment of the invention. In operation 210, a first metal electrode is formed.

In operation 220 a chemically adhered monolayer that includes praseodymium is formed over a portion of the first metal electrode. In one embodiment, the monolayer is praseodymium metal. Other examples of monolayers that include praseodymium are dependent upon precursor choice for a given monolayer deposition method. In some embodiments, for example, monolayers that include praseodymium also include organic elements such as oxygen, carbon, hydrogen, nitrogen, etc.

In operation 230, the chemically adhered monolayer is oxidized to form a praseodymium oxide monolayer. Sources of oxidation include, but are not limited to, water vapor, oxygen gas, ozone, etc. In one embodiment, a praseodymium oxide layer includes $Pr_2O_3$. Other stoichiometries and/or variations in $Pr_2O_3$ elemental ratios are acceptable provided that the desired dielectric properties are satisfied. At least one praseodymium oxide monolayer formed as described above serves as a dielectric in a capacitor. In selected embodiments, multiple praseodymium oxide monolayers are formed sequentially to build up a thicker dielectric structure as desired.

In operation 240, a second metal electrode is formed over the dielectric with the dielectric separating the first metal electrode and the second metal electrode to form a capacitor. In one example, the metal electrodes are formed from only a metal element. In one example, the metal electrodes are formed from metal compounds that are conductive such as titanium nitride or titanium silicon nitride. In one example, each metal electrode is formed from the same metal material. In other examples, the metal electrodes are formed from different materials.

In one example, one or more metal electrodes are formed from metals such as aluminum, copper, tungsten, etc. with interfacial layers between the metal electrodes and the dielectric. In some examples, interfacial layers are conductive, and can be considered part of the electrode. In some examples, interfacial layers are insulating or less conductive, and can be considered part of the dielectric.

Processing steps described above detail chemically adhered monolayer deposition techniques used to form a dielectric between a first electrode and a second electrode. In selected embodiments, either the first electrode, the second electrode, or both electrodes are also formed using chemically adhered monolayer deposition techniques.

During a monolayer deposition process, variables such as temperature and pressure, duration, etc. are chosen to tailor a desired morphology. For example, in one embodiment monolayers are deposited in a substantially amorphous state. In multiple layer embodiments, the resulting layer stack is likewise substantially amorphous. Other processing variables can also be chosen to produce micro-crystalline or nano-crystalline microstructures. As mentioned above, microstructures such as nano-crystallinity in selected embodiments provide enhanced properties such as improved film durability. Amorphous dielectric materials provide lower leakage currents due to the lack of defects along grain boundaries.

As discussed above, monolayer deposition of material layers provides a number of useful properties for dielectrics and capacitor electrodes. One method of depositing monolayers includes atomic layer deposition (ALD). Another method of depositing monolayers includes metalorganic chemical vapor deposition (MOCVD) using gaseous or liquid-injection precursors similar to ALD. ALD was developed in the early 1970's as a modification of CVD and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas such as an inert gas and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favorable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which is an important characteristic for applications such as planar substrates, deep trenches, and in material deposition on porous materials, other high surface area materials, powders, etc. Examples include, but are not limited to porous silicon, alumina powders, etc. Significantly, ALD provides for controlling deposition thickness by controlling the number of growth cycles.

The precursors used in an ALD process may be gaseous, liquid or solid. Typically, liquid or solid precursors are volatile. The vapor pressure must be high enough for effective mass transportation. Also, solid and some liquid precursors are heated inside the reaction chamber and introduced through heated tubes to the substrates. The necessary vapor pressure is reached at a temperature below the substrate temperature to avoid the condensation of the precursors on the substrate. Due to the self-limiting growth mechanisms of ALD, relatively low vapor pressure solid precursors can be used though evaporation rates may vary somewhat during the process because of changes in their surface area.

There are several other considerations for precursors used in ALD. Thermal stability of precursors at the substrate temperature is a factor because precursor decomposition affects the surface control. ALD is heavily dependent on the reaction of the precursor at the substrate surface. A slight decomposition, if slow compared to the ALD growth, can be tolerated.

The precursors chemisorb on or react with the surface, though the interaction between the precursor and the surface as well as the mechanism for the adsorption is different for different precursors. The molecules at the substrate surface react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction are typically gaseous in order to allow for easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse or chamber evacuation to remove excess precursor and by-products from the reaction chamber prior to pulsing the next precursor of the fabrication sequence.

Using RS-ALD, films can be layered in equal metered sequences that are essentially identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

RS-ALD provides for high continuity at an interface compared with other techniques such as CVD; conformality over difficult topography on a substrate, use of low temperature and mildly oxidizing processes, growth thickness dependent solely on the number of cycles performed, and ability to engineer multilayer laminate films with resolution of one to two monolayers. RS-ALD allows for deposition control on the order of monolayers and the ability to deposit monolayers of amorphous films.

RS-ALD processes provide for robust deposition of films or other structures. Due to the unique self-limiting surface reaction materials that are deposited using RS-ALD, such films are free from processing challenges such as first wafer effects and chamber dependence. Accordingly, RS-ALD processes are easy to transfer from development to production and from 200 to 300 mm wafer sizes in production lines. Thickness depends solely on the number of cycles. Thickness can therefore be dialed in by controlling the number of cycles.

Laminate structures of multiple layers formed using ALD can also be subsequently processed to mix the individual layers together. For example, a laminate structure can be annealed to mix a plurality of different layers together, thus forming an alloy or a mixture of layer chemistries. By forming a laminate structure using ALD, and subsequently mixing the layers, the chemistry of the resulting structure is precisely controlled. Because the laminate is made up of self-limiting monolayers over a known surface area, the number of molecules from each individual layer is known to a high degree of accuracy. Chemistry can be controlled by adding or subtracting one or more layers in the laminate.

Subsequent processing of layer is also useful to reconfigure a multiple layer microstructure. An example of microstructure conversion includes annealing multiple layers to provide larger more homogenous grain size. Another example of microstructure conversion includes annealing multiple layers to convert all or a portion of an amorphous microstructure to a fine crystal structure. In some examples, chemistry is mixed while preserving an amorphous microstructure.

One example of using ALD or other monolayer methods to control chemistry includes forming a titanium silicon nitride electrode. A laminate of layers including titanium containing layers and silicon containing layers can be processed to mix the layers and also react with nitrogen to form a titanium silicon nitride structure with precisely controlled chemistry. Another example includes forming praseodymium oxynitride. A laminate of layers including praseodymium oxide and praseodymium nitride can be processed to mix the layers to form a praseodymium oxynitride with precisely controlled chemistry.

Figure 3:
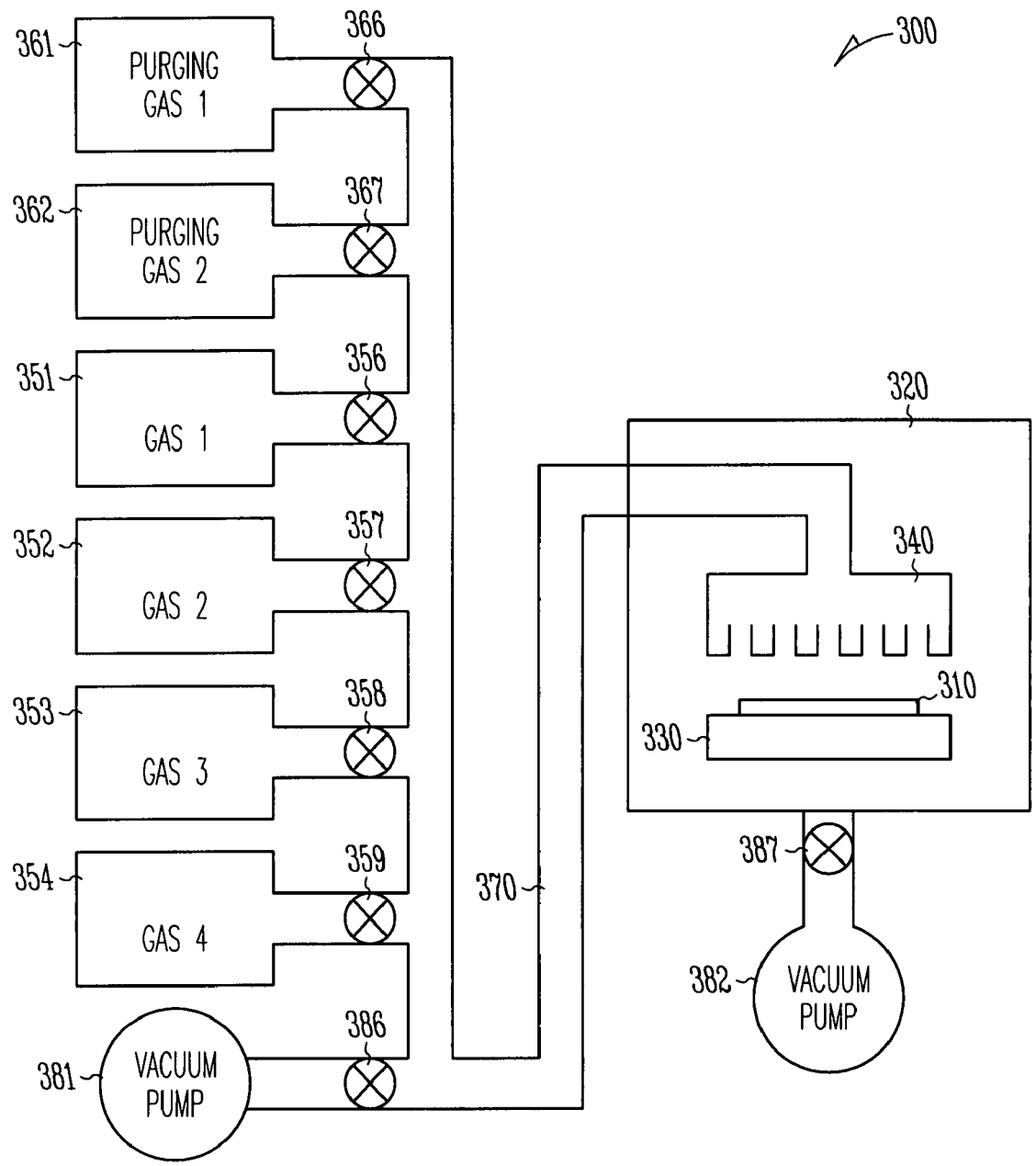
FIG. 3 shows a material deposition system according to an embodiment of the invention.

FIG. 3 shows an embodiment of an atomic layer deposition system for processing praseodymium containing layers, titanium containing layers, or other metal layers according to the teachings of the present invention. The elements depicted are those elements necessary for discussion such that those skilled in the art may practice embodiments of the present invention without undue experimentation.

In FIG. 3, a substrate 310 is located inside a reaction chamber 320 of ALD system 300. Also located within the reaction chamber 320 is a heating element 330 which is thermally coupled to substrate 310 to control the substrate temperature. A gas-distribution fixture 340 introduces precursor gases to the substrate 310. Each precursor gas originates from individual gas sources 351-354 whose flow is controlled by mass-flow controllers 356-359, respectively. The gas sources 351-354 provide a precursor gas either by storing the precursor as a gas or by providing a location and apparatus for evaporating a solid or liquid material to form the selected precursor gas.

Also included in the ALD system 300 are purging gas sources 361, 362, each of which is coupled to mass-flow controllers 366, 367, respectively. The gas sources 351-354 and the purging gas sources 361-362 are coupled by their associated mass-flow controllers to a common gas line or conduit 370 which is coupled to the gas-distribution fixture 340 inside the reaction chamber 320. Gas conduit 370 is also coupled to vacuum pump, or exhaust pump, 381 by mass-flow controller 386 to remove excess precursor gases, purging gases, and by-product gases at the end of a purging sequence from the gas conduit 370.

Vacuum pump, or exhaust pump, 382 is coupled to mass-flow controller 387 to remove excess precursor gases, purging gases, and by-product gases at the end of a purging sequence from the reaction chamber 320. For convenience, control displays, mounting apparatus, temperature sensing devices, substrate maneuvering apparatus, and necessary electrical connections as are known to those skilled in the art are not shown in FIG. 3. Although ALD system 300 is illustrated as an example, other ALD systems may be used.

Using ALD methods as described above, there are a number of different precursor chemistries that can be used to form monolayers including praseodymium, monolayers containing titanium, or monolayers containing other metals according to embodiments of the present invention. One example chemistry for praseodymium oxide includes $Pr(mmp)_3$ and $H_2O$ as reactant gasses (where mmp=$OCMe_2CH_2OMe$). In one example, self-limiting growth occurs at substrate temperatures ranging from 150° C. to 450° C. One example of a resulting praseodymium oxide film includes $Pr_2O_3$ with some degree of crystallinity.

One example of chemistry for Pr—O—N includes $Pr(mmp)_3$ and $H_2O$ and further includes $NH_3$ as a reactant gas. One example of chemistry for titanium nitride includes $TiCl_4$ reacted with ammonia. In one example, a resulting titanium nitride film includes TiN although varying chemistries denoted as $TiN_x$ are also within the scope of the invention.

One example of chemistry for titanium silicon nitride includes reacting $Ti[N(CH_2)_2]_4$ (or tetrakis(dimethylamido) titanium), silane ($SiH_4$), and ammonia ($NH_3$) in sequential order.

Although selected examples of precursors, oxidizers, nitriding precursors, etc. and process conditions are listed above, embodiments of the invention are not so limited. One of ordinary skill in the art, having the benefit of the present disclosure, will recognize that other chemistries and process conditions that form monolayers with praseodymium, titanium, silicon, etc. can be used.

On a larger device scale, metal-insulator-metal capacitors formed using methods as described above are integrated into a variety of circuits and systems. For example, capacitors as described above are used as storage capacitors for semiconductor memory. Capacitors as described are also used as components in radio frequency integrated circuit (RFIC) or mixed signal circuits. Capacitors with praseodymium oxide dielectrics formed using methods described in the present disclosure include capacitors with leakage currents on the order of $10^{-7}$ A/cm$^2$. Capacitors with praseodymium oxide dielectrics formed using methods described in the present disclosure further include capacitors with capacitance densities on the order of 20 fF/cm$^2$.

Figure 4:
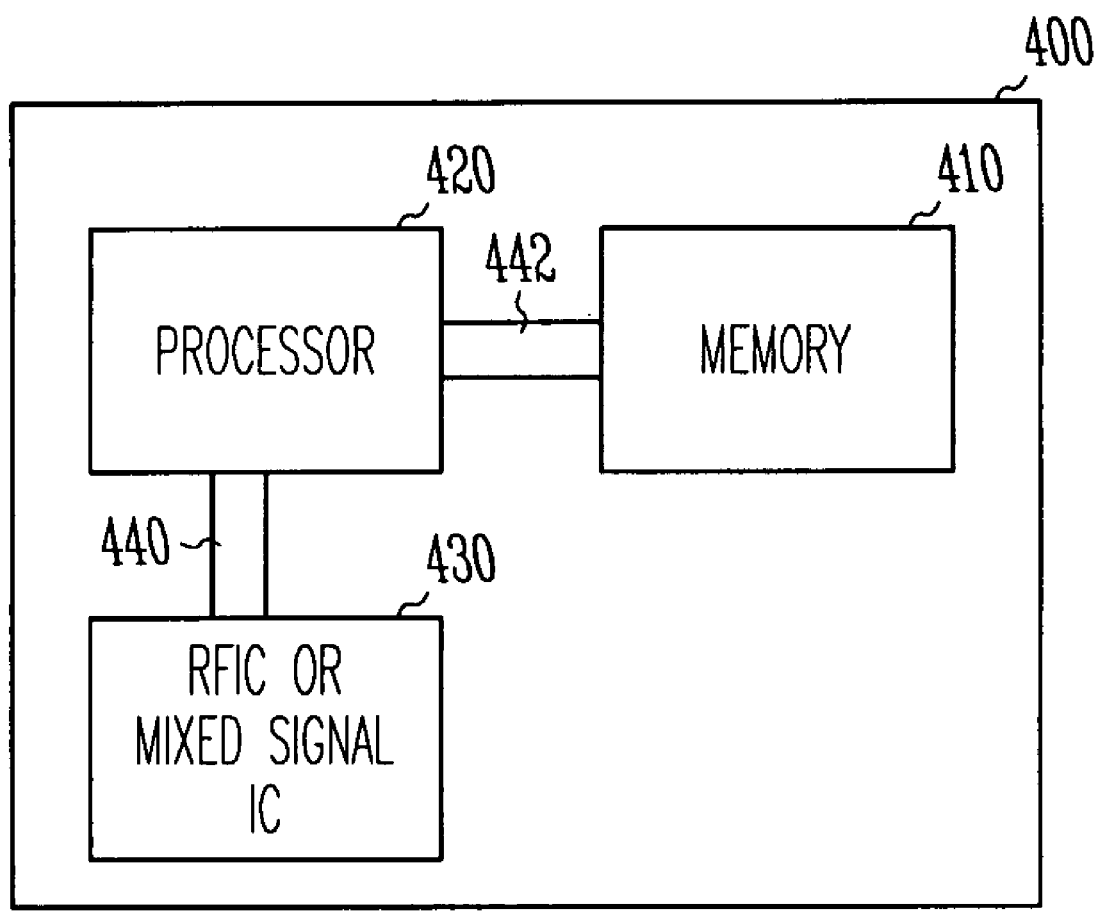
FIG. 4 shows a block diagram of an electronic device according to an embodiment of the invention.

FIG. 4 illustrates an example of an electronic device 400 that includes metal-insulator-metal capacitors formed using monolayer deposition methods such as ALD as described above. In one embodiment, the electronic device 400 is formed as an integrated circuit on a single semiconductor chip. Although the elements of the electronic device 400 may be included on a single semiconductor chip, embodiments of the invention are not so limited. Multiple chips can also be electrically connected to form the electronic device 400.

The electronic device 400 of FIG. 4 includes a processor 420 coupled to a memory device 410 through circuitry 442. In one embodiment, the electronic device 400 also includes a communication circuit 430 such as an RFIC or a mixed signal integrated circuit. The communication circuit 430 is shown in FIG. 4 coupled to the processor 420 through circuitry 440. Any one or more of the components shown in the electronic device 400 can include metal-insulator-metal capacitors formed using methods as described in the present disclosure. Examples of an electronic device 400 include, but are not limited to, cellular telephones, global positioning systems (GPS) personal digital assistants, handheld computing devices, imaging devices, etc. Other electronic device examples include memory devices with capacitor data storage.

While a number of improved features of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description. The scope of the invention includes any other applications in which the above structures and methods are used. The scope of the invention should be determined with reference to the appended claims, along with the full scope of equivalents to which such claims are entitled.

What is claimed is:

1. A method of forming a capacitor, comprising:
   forming a first metal electrode;
   forming a dielectric layer over a portion of the first metal electrode, including:
      forming a chemically adhered monolayer that includes praseodymium;
      oxidizing the chemically adhered monolayer to form a praseodymium oxide monolayer;
      forming a second metal electrode over the dielectric layer; and
   forming interfacial layers between the dielectric layer and the metal electrodes, wherein forming interfacial layers between the dielectric layer and the metal electrodes includes forming Pr—O—N interfacial layers.

2. The method of claim 1, wherein forming the dielectric layer includes sequentially forming a plurality of layers, wherein forming each layer of the plurality of layers includes forming a chemically adhered monolayer that includes praseodymium, and oxidizing the chemically adhered monolayer to form a praseodymium oxide monolayer.

3. The method of claim 2, further including subsequent processing of the plurality of layers to enhance a property of the dielectric layer.

4. The method of claim 1, wherein forming the first metal electrode includes forming a chemically adhered monolayer that includes titanium and nitriding the chemically adhered monolayer to form a titanium nitride monolayer.

5. The method of claim 4, wherein forming the second metal electrode includes forming a chemically adhered monolayer that includes titanium and nitriding the chemically adhered monolayer to form a titanium nitride monolayer.

6. The method of claim 1, wherein forming the first metal electrode includes sequentially forming a plurality of layers, wherein forming each layer of the plurality of layers includes forming a chemically adhered monolayer that includes titanium, and nitriding the chemically adhered monolayer to form a titanium nitride monolayer.

7. The method of claim 1, wherein forming the first metal electrode includes forming a titanium silicon nitride electrode.

8. The method of claim 1, wherein forming the first metal electrode includes forming a chemically adhered monolayer that includes titanium and forming a chemically adhered monolayer that includes silicon and nitriding the chemically adhered monolayers to form a titanium silicon nitride layer.

9. The method of claim 1, wherein forming Pr—O—N interfacial layers includes forming layers including approximately 40 atomic percent praseodymium, approximately 20 atomic percent oxygen, and approximately 40 atomic percent nitrogen.

10. A method of forming a capacitor, comprising:
   forming a first metal electrode by nitriding a chemically self-limiting monolayer including titanium;
   forming a dielectric layer over a portion of the first metal electrode, including oxidizing a chemically self-limiting monolayer including praseodymium;
   forming a second metal electrode over the dielectric layer by nitriding a chemically self-limiting monolayer including titanium;
   processing the dielectric layer to change a microstructure of the dielectric layer; and
   forming Pr—O—N layers between the dielectric layer and the metal electrodes.

11. The method of claim 10, wherein forming the dielectric layer over the portion of the first metal electrode includes atomic layer deposition (ALD) of a $Pr_2O_3$ monolayer.

12. The method of claim 11, wherein atomic layer deposition (ALD) of a $Pr_2O_3$ monolayer includes oxidizing a layer formed by a $Pr(mmp)_3$ precursor, where mmp=$OCMe_2CH_2OMe$.

13. The method of claim 10, wherein forming the first metal electrode by nitriding the chemically self-limiting monolayer including titanium includes atomic layer deposition (ALD) of a Ti—Si—N monolayer.

14. The method of claim 13, wherein atomic layer deposition (ALD) of a Ti—Si—N monolayer includes sequential deposition of $Ti[N(CH_2)_2]_4$, silane ($SiH_4$) and ammonia ($NH_3$).

15. The method of claim 10, wherein forming the second metal electrode by nitriding the chemically self-limiting monolayer including titanium includes atomic layer deposition (ALD) of a TiN monolayer.

16. A method of forming an electronic device, comprising:
   forming a number of storage capacitors, including:
      forming a first metal electrode;
      forming a dielectric layer over a portion of the first metal electrode, including:
         sequentially forming a plurality of layers, wherein forming each layer of the plurality of layers includes forming a chemically adhered monolayer that includes praseodymium, and oxidizing the chemically adhered monolayer to form a praseodymium oxide monolayer; and
         subsequently processing the plurality of layers to change a microstructure of the dielectric layer; and
      forming a second metal electrode over the dielectric layer;
      forming Pr—O—N layers between the dielectric layer and the metal electrodes;

coupling the plurality of storage capacitors to respective access transistors to form a memory array; and
coupling a processor circuit to the memory array.

17. The method of claim 16, wherein forming the number of storage capacitors includes forming at least one planar capacitor.

18. The method of claim 16, wherein forming the number of storage capacitors includes forming at least one trench capacitor.

19. A method of forming a capacitor, comprising:
    forming a first metal electrode;
    forming a first interfacial layer over the first metal electrode, including oxidizing and nitriding a chemically self-limiting monolayer including praseodymium;
    forming a dielectric layer over a portion of the first interfacial layer, including oxidizing a chemically self-limiting monolayer including praseodymium;
    forming a second interfacial layer over the dielectric layer, including oxidizing and nitriding a chemically self-limiting monolayer including praseodymium;
    processing the dielectric layer to change a microstructure of the dielectric layer; and
    forming a second metal electrode over the second interfacial layer.

* * * * *